(12) United States Patent
Brox et al.

(10) Patent No.: US 11,069,397 B2
(45) Date of Patent: Jul. 20, 2021

(54) PHASE CLOCK CORRECTION

(71) Applicant: Micron Technology, Inc., Boise, ID (US)

(72) Inventors: Martin Brox, Munich (DE); Maksim Kuzmenka, Munich (DE)

(73) Assignee: Micron Technology, Inc., Boise, ID (US)

(*) Notice: Subject to any disclaimer, the term of this patent is extended or adjusted under 35 U.S.C. 154(b) by 32 days.

(21) Appl. No.: 16/371,414

(22) Filed: Apr. 1, 2019

(65) Prior Publication Data

US 2020/0312399 A1 Oct. 1, 2020

(51) Int. Cl.
*G11C 11/4076* (2006.01)
*H03K 3/017* (2006.01)
*G11C 11/402* (2006.01)

(52) U.S. Cl.
CPC ...... *G11C 11/4076* (2013.01); *G11C 11/4023* (2013.01); *H03K 3/017* (2013.01)

(58) Field of Classification Search
CPC .................................................. G11C 11/4076
USPC ....................................................... 365/149
See application file for complete search history.

(56) References Cited

U.S. PATENT DOCUMENTS

| | | | |
|---|---|---|---|
| 10,218,343 B1* | 2/2019 | Tomar | G11C 7/222 |
| 2004/0075462 A1* | 4/2004 | Kizer | H03K 5/1565 326/29 |
| 2015/0249454 A1* | 9/2015 | Giaconi | H04L 7/0332 375/376 |

* cited by examiner

*Primary Examiner* — Muna A Techane
(74) *Attorney, Agent, or Firm* — Holland & Hart LLP

(57) ABSTRACT

Methods, systems, and devices for phase clock correction are described. The clock correction may, in some examples, include two stages of duty cycle adjustment. In a first stage, the duty cycles of multiple clock signals may be adjusted. These clock signals may be based on an input clock signal and its complement. The duty cycle adjustment provided to a clock signal during this stage may be based on a difference between the duty cycle of the clock signal before adjustment and the duty cycle of another clock signal. In the second stage, the duty cycle of the input clock signal and its complement may be adjusted. The duty cycle adjustment provided to the input clock signal and/or its complement may be based on clock signals generated from the multiple clock signals after their duty cycles have been adjusted.

16 Claims, 8 Drawing Sheets

PHASE CLOCK CORRECTION

BACKGROUND

The following relates generally to a system that includes at least one memory device and more specifically to phase clock correction.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

A memory device may use multiple clock signals to convey timing information for various operations. Component imperfections, however, may result in non-ideal phase offsets between the clock signals. Techniques for correcting phase errors between multiple clock signals may be desired.

DETAILED DESCRIPTION

Figure 1:
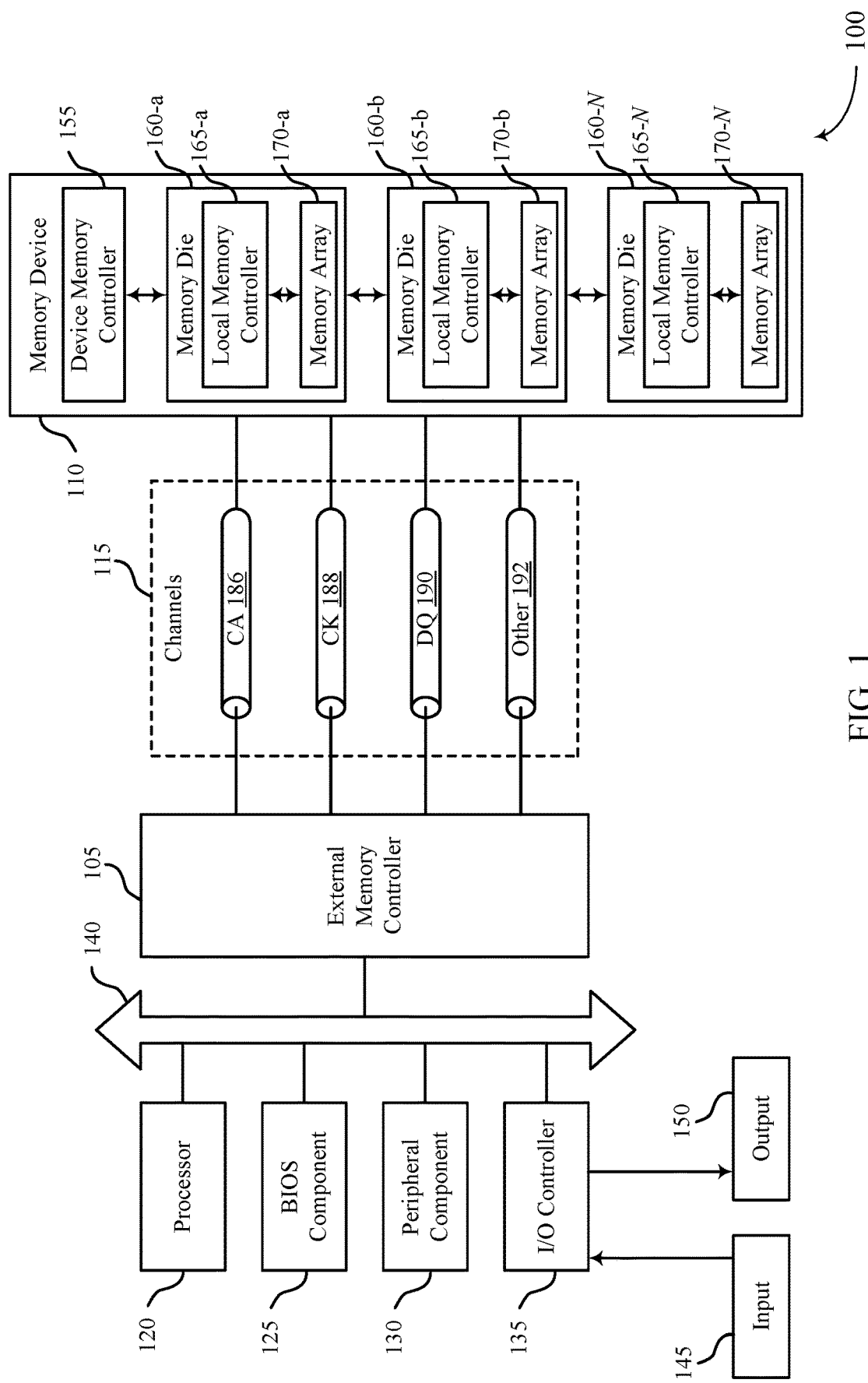
FIG. 1 illustrates an example of a system that supports phase clock correction in accordance with examples as disclosed herein.

A memory device may correct for phase offsets or variances in one or more clock signals by implementing a correction process, which may be a two-stage correction process. Such a process may involve adjusting the duty cycle of one or more clock signals (e.g., low frequency clock signals), and using the adjusted one or more signals as a basis for adjusting the duty cycle of one or more incoming clock signals (e.g., high frequency clock signals) from which the other (e.g., low frequency) clock signals were derived.

A memory device may use one or more clock signals (e.g., a high frequency clock signal) to time its operations. It may be difficult, however, to distribute the clock signal (e.g., the high frequency clock signal) through the memory device due to the filter-like nature of the traces used. For example, the traces may act like low pass filters that attenuate signals over a certain frequency (e.g., the cutoff frequency of the trace metallization). To overcome this issue, a memory device may use a clock signal, such as a high frequency clock signal, to generate multiple other (e.g., low frequency) clock signals that are offset in phase. These multiple other clock signals may represent the same information as a high frequency clock signal (e.g., the edges of the low frequency clock signals may align with the edges of the high frequency clock), but may propagate throughout the device without experiencing the same degradation as the one or more distinct (e.g., high frequency) clock signals.

In some examples, the information of a high frequency clock signal may be lost if low frequency clocks have non-ideal phase offsets (e.g., errors or variations in phase). Such offsets may be introduced by the components used to generate one or more low frequency clock signals, or may be caused by noise or duty-cycle errors in the high frequency clock signal (e.g., that may serve as the basis for or relate to the low frequency clock signals).

According to the techniques described herein, a memory device may correct for phase errors or variations by employing an correction scheme, which may include two stages of duty-cycle adjustment. The correction scheme may include generating multiple (e.g., four) low frequency clock signals from a high frequency clock signal and its complement. The low frequency clock signals may be even spaced in phase (e.g., offset by 90°), plus or minus a phase error in some cases. In the first duty cycle-adjustment stage, the duty cycles of the low frequency clock signals that have phases of 0° and 180°, as one example, may be adjusted so that they match (e.g., are both 50% so that the duration of the high phase is equal to the duration of the low phase). Similarly, the duty cycles of the low frequency clock signals that have phases of 90° and 270° may be adjusted so that they match (e.g., are both 50% so that the duration of the high phase is equal to the duration of the low phase). Thus, at the end of stage one, the edges of the 0° and 180° clock signals may align with each other, and the edges of the 90° and 270° clock signals may align with each other. But the two pairs of clock signals may still be incorrectly offset with respect to one another.

To provide proper spacing between multiple sets of clock signals (e.g., 90° between all four low frequency clock signals), low frequency clock signals with adjusted duty cycles may be used to generate a clock signal and its complement, both of which may have the same frequency as the high frequency clock signal. If the clock signal and its complement have different duty cycles, the difference between the duty cycles may serve as the basis for setting or adjusting the second duty cycle-adjustment stage. In this stage, the duty cycle of the incoming high frequency and/or its complement may be adjusted. After performing stage two, multiple (e.g., all four low frequency) clock signals distributed by the device may be evenly spaced in the phase domain.

Features of the disclosure introduced above are further described with reference to FIGS. 1 and 2 in the context of memory devices, systems, and circuits that support multiple phase clock correction. Specific examples are then described with reference to FIGS. 3 through 9, which illustrate circuitry that performs clock correction and associated waveforms. These and other features of the disclosure are further described with respect to FIG. 10, which illustrates a flowchart that supports multiple phase clock correction.

FIG. 1 illustrates an example of a system 100 that supports phase clock correction in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may be an example of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 may be configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines (e.g., traces or transmission lines), transistors, capacitors, inductors, transformers, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. The clock signal may control the timing of operations within the system 100. In some cases, the external memory controller 105 may include a common data clock that generates a common (source) data clock signal.

The system clock signal may be a first clock signal having a frequency (e.g., a high frequency clock signal) that is above the cutoff frequency of the traces used to convey signals throughout the system 100. So in some cases, the external memory controller 105 may use the system clock signal to generate multiple (e.g., four) clock signals that have different (e.g., lower) frequencies (e.g., frequencies that are one half the frequency of the system clock signal). The different (e.g., lower) frequency clock signals may convey the same information as the first clock signal (e.g., the high frequency system clock signal), but may be distributed throughout the system 100 without deteriorating from the low-pass filter qualities of one or more elements.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like). In some cases, the system clock signal may serve as the basis for lower frequency clock signals that represent the same information as the system clock signal.

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

As noted, a system 100 may distribute some clock signal (e.g., low frequency clock signals) that are derived from one or more other clock signals (e.g., a higher frequency clock signal). If properly offset in phase, the edges of the low frequency clock signals, as one example, may represent the same timing information as the higher frequency clock signal. However, if non-ideal components of the system 100 introduce phase errors to the low frequency clocks, the low frequency clocks may lose the timing information of the higher frequency clock (e.g., the timing information may become distorted).

According to the techniques described herein, a system 100 may correct for phase errors in low frequency clock signals that are constructed based on a high frequency clock signal. The system 100 may first adjust the duty cycle of the low frequency clock signals so that they match. After the duty cycles of the low frequency clocks are adjusted, the system 100 may use low frequency clock signals to construct a full frequency clock signal (e.g., a clock signal with the same frequency as the high frequency clock signal) and, in some examples, its complement. The system 100 may also adjust the duty cycle of the high frequency clock based on the duty cycle of the full frequency clock signal and its complement.

Figure 2:
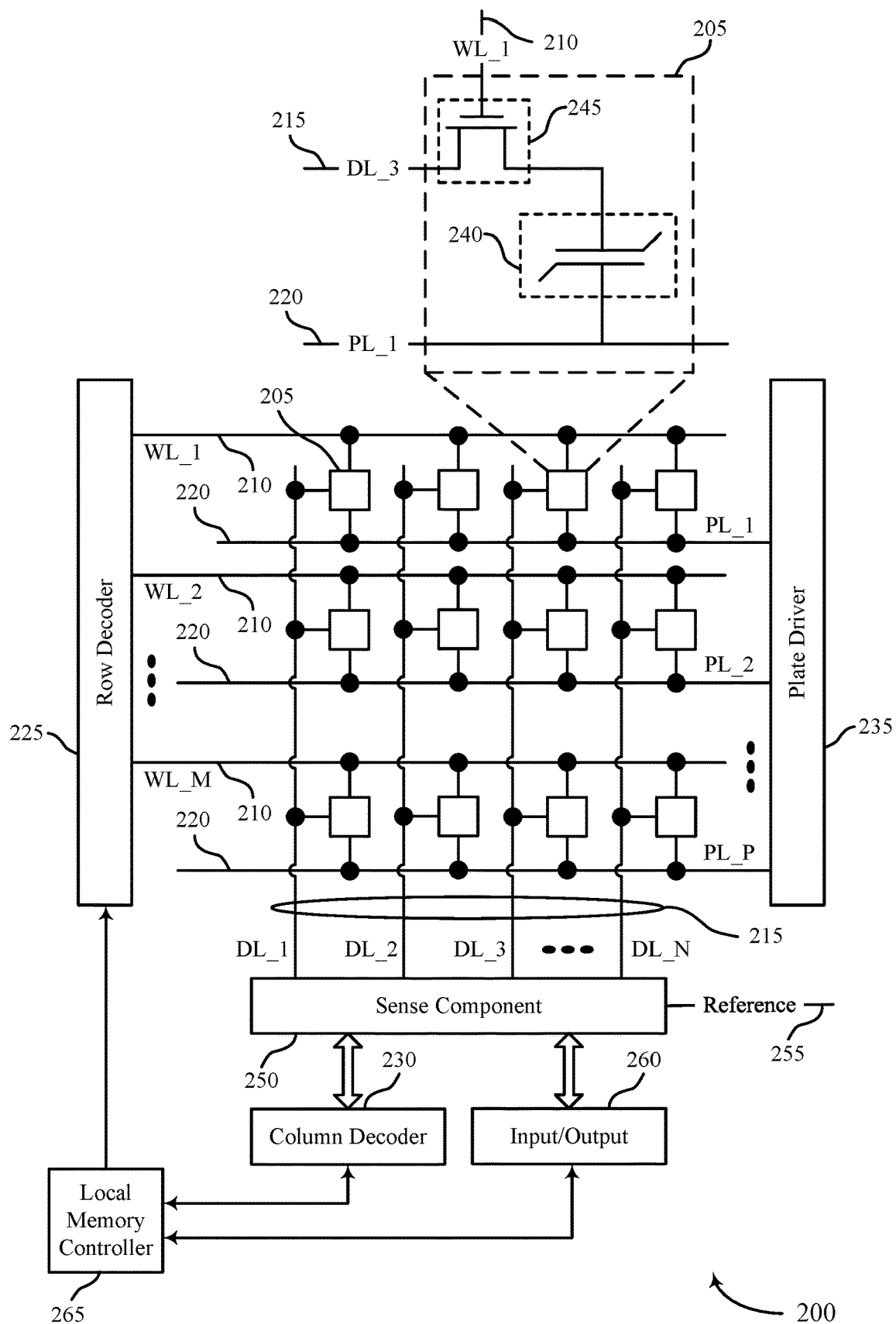
FIG. 2 illustrates an example of a memory die that supports phase clock correction in accordance with examples as disclosed herein.

FIG. 2 illustrates an example of a memory die 200 that supports phase clock correction in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that may include a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. The timing of the operations may be controlled based on one or more clock signals. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and may activate a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line that is used to perform access operations on memory cell(s) 205 with which it is in electronic communication. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line that is used to perform access operations on memory cell(s) 205 with which it is in electronic communication. The plate line 220 may be in electronic communication with a node (e.g., the cell bottom) of the capacitor 240. The plate line 220 may be configured (e.g., with the digit line 215) to bias the capacitor 240 during an access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change.

The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0.

The sense component 250 may include various transistors or amplifiers to detect and amplify a difference in one or more signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, the plate driver 235, or other components, or any combination thereof.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The timing of various operations by memory die 200 may be controlled by, or based, on timing information conveyed by one or more clock signals. The clock signals may be low frequency clock signals that may be generated from a high frequency clock signal (and its complement, in some cases). The memory die 200 may correct for phase errors in the low frequency clock signals by adjusting the duty cycle of the low frequency clock signals, then using the adjusted low frequency clock signals as a basis for adjusting the duty cycle of the high frequency clock signal (and its complement, in some cases).

Figure 3:
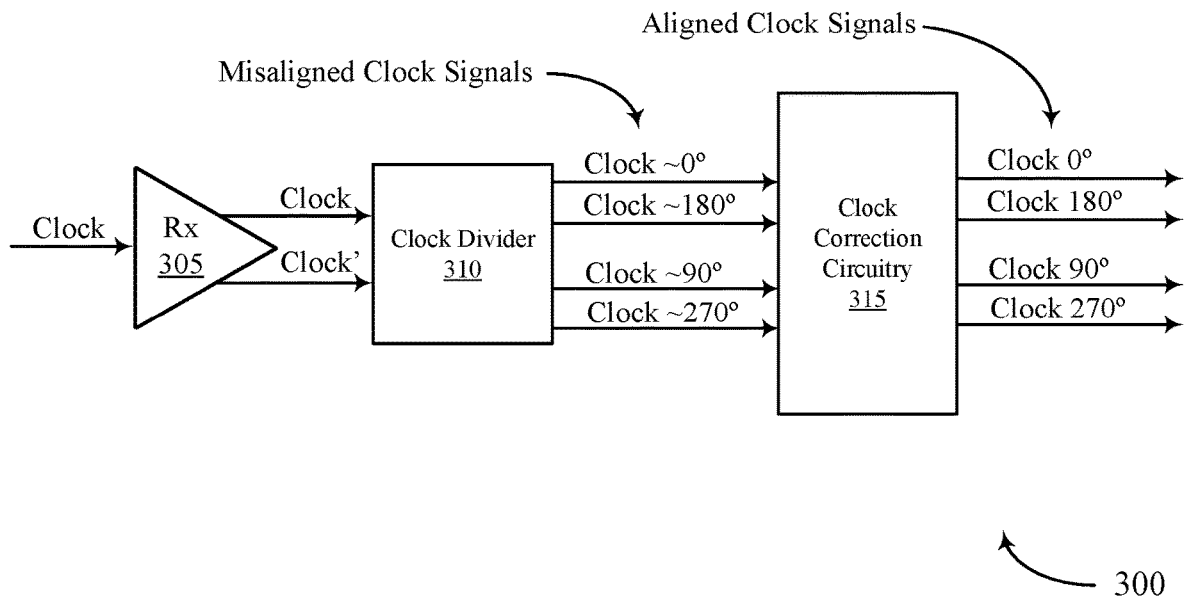
FIG. 3 illustrates an example of clock circuitry that supports phase clock correction in accordance with examples as disclosed herein.

FIG. 3 illustrates an example of clock circuitry 300 that supports phase clock correction in accordance with examples as disclosed herein. Clock circuitry may include receive circuit 305, clock divider 310, and clock correction circuitry 315. Receive circuit 305 may receive a high frequency clock as an input and generate its complement. A signal's complement may be a version of the signal that is shifted in phase by 180°. A signal and its complement may be referred to herein as differential signals, and the complemented version of a signal may be denoted with an apostrophe (e.g., the complemented version of a signal A may be denoted A'). Thus, receive circuit 305 may output differential clock signals which include the high frequency clock signal (Clock) and its complement (Clock').

The differential clock signals may be received by clock divider 310, which may generate multiple (e.g., four) low frequency clock signals based on Clock and Clock'. The low frequency clock signals may have half the frequency of the high frequency clock signal and may be offset in phase by 90° (e.g., in an ideal system) or nearly 90° (e.g., in a non-ideal system). Thus, in a non-ideal system, clock divider 310 may output a first clock signal that has a phase offset of exactly or approximately 0°, a second clock signal that has a phase offset of exactly or approximately 90°, a third clock signal of exactly or approximately 180°, and a fourth clock signal that has a phase offset of exactly or approximately 270°. The difference between the ideal phase of a clock signal and its approximate phase may be referred to as the signal's phase error or variation. Such errors or variations may arise from irregularities in or caused by the components of receive circuit 305, clock divider 310, or from noise or duty cycle errors in the high frequency clock.

According to the techniques described herein, the clock correction circuitry 315 may correct for phase errors by adjusting the duty cycle of the high frequency clock signal and its complement as well as the duty cycles of the low frequency clocks signals. Thus, the output of the clock correction circuitry 315 may be low frequency signals (e.g., signals with a lower frequency than the other, high frequency clock signal) with ideal duty cycles and ideal phases. Although shown as a separate circuit, the components of the clock correction circuitry 315 may be distributed throughout the clock circuitry 300 or may be contained or integrated within a single component.

Figure 4:
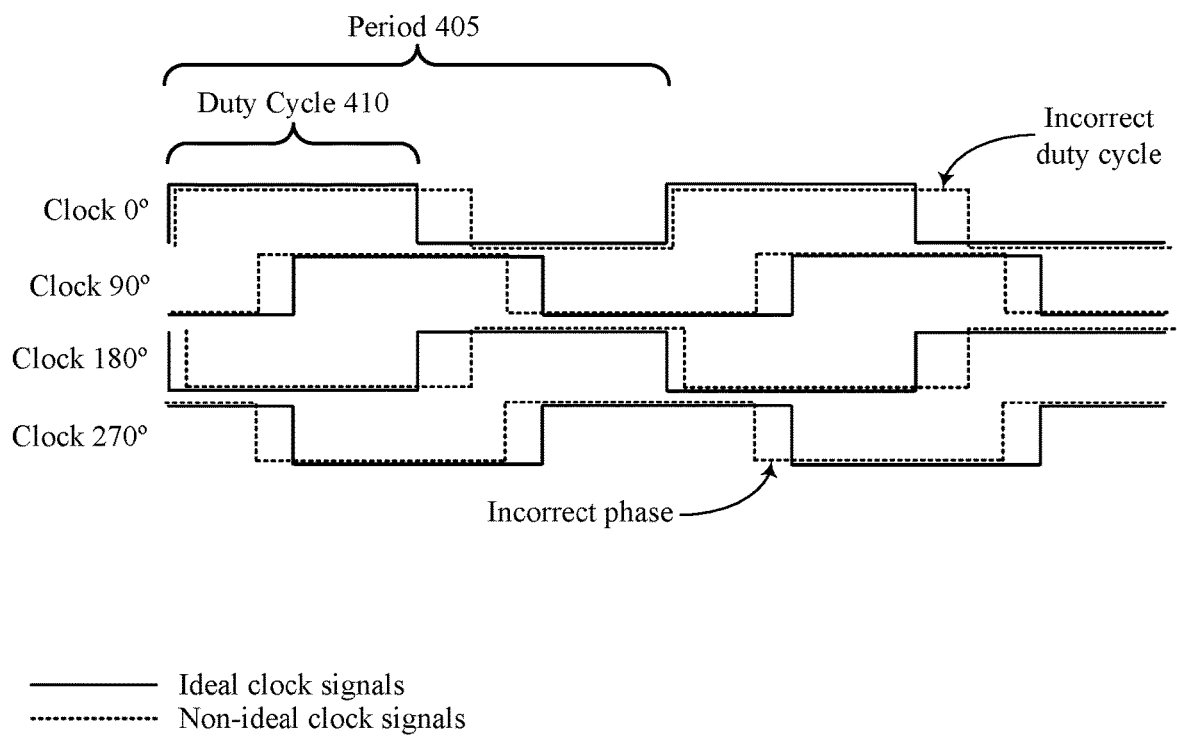
FIG. 4 illustrates an example of clock signals that support phase clock correction in accordance with examples as disclosed herein.

FIG. 4 illustrates an example of clock signals 400 that support phase clock correction in accordance with examples as disclosed herein. Clock signals with solid lines may be ideal clock signals (e.g., clock 0°, clock 90°, clock 180°, and clock 270°) that are output (or should be output) by the clock correction circuitry 315 as described with reference to FIG. 3. Thus, clock signals 400 may include clock signals with 0°, 90°, 180°, and 270° phases. Each clock signal may have a period and a duty cycle. The period of a clock signal may be the duration of time between rising (or falling) edges of the signal. For example, the period of ideal clock 0° may be period 405. The duty cycle of a clock signal may be the ratio of a phase (e.g., the high phase) to the period. For example, the duty cycle of ideal clock 0° may be duty cycle 410.

The dashed clock signals may represent non-ideal clock signals that may, in some examples, be output by clock divider 310. Non-ideal clock signals may have incorrect duty cycles (e.g., duty cycles other than 50%, as shown by the non-ideal clock signals corresponding to clock 0° and clock 180°) and/or may be improperly delayed (e.g., incorrectly offset in phase, as shown by the non-ideal clock signals corresponding to clock 90° and clock) 270°. The difference between the edges of the clock signals output by clock divider 310 and the edges of ideal clock signals may represent the phase error or delay error. Without correction, the non-ideal clock signals may convey incorrect timing information due to the incorrect positioning of the rising and falling clock edges. Thus, correcting the clock signals may improve the operations of a device that is using the clock signals to control the timing of its operations.

According to the techniques described herein, multiple non-ideal clock signals may be corrected using a duty cycle adjustment scheme. In some examples, this scheme may include a two stage duty cycle adjustment scheme. The first stage of duty cycle adjustment may correct the duty cycles of the clock signals so that they are equal (e.g., 50% so that the duration of the high phase is half the duration of the period). The second stage of duty cycle adjustment may correct phase offset between the clock signals. In some alternative embodiments, the correction of phase offset between the clock signals may occur at the same time as or before the correction of the duty cycles of the clock signals so that they are equal.

Figure 5:
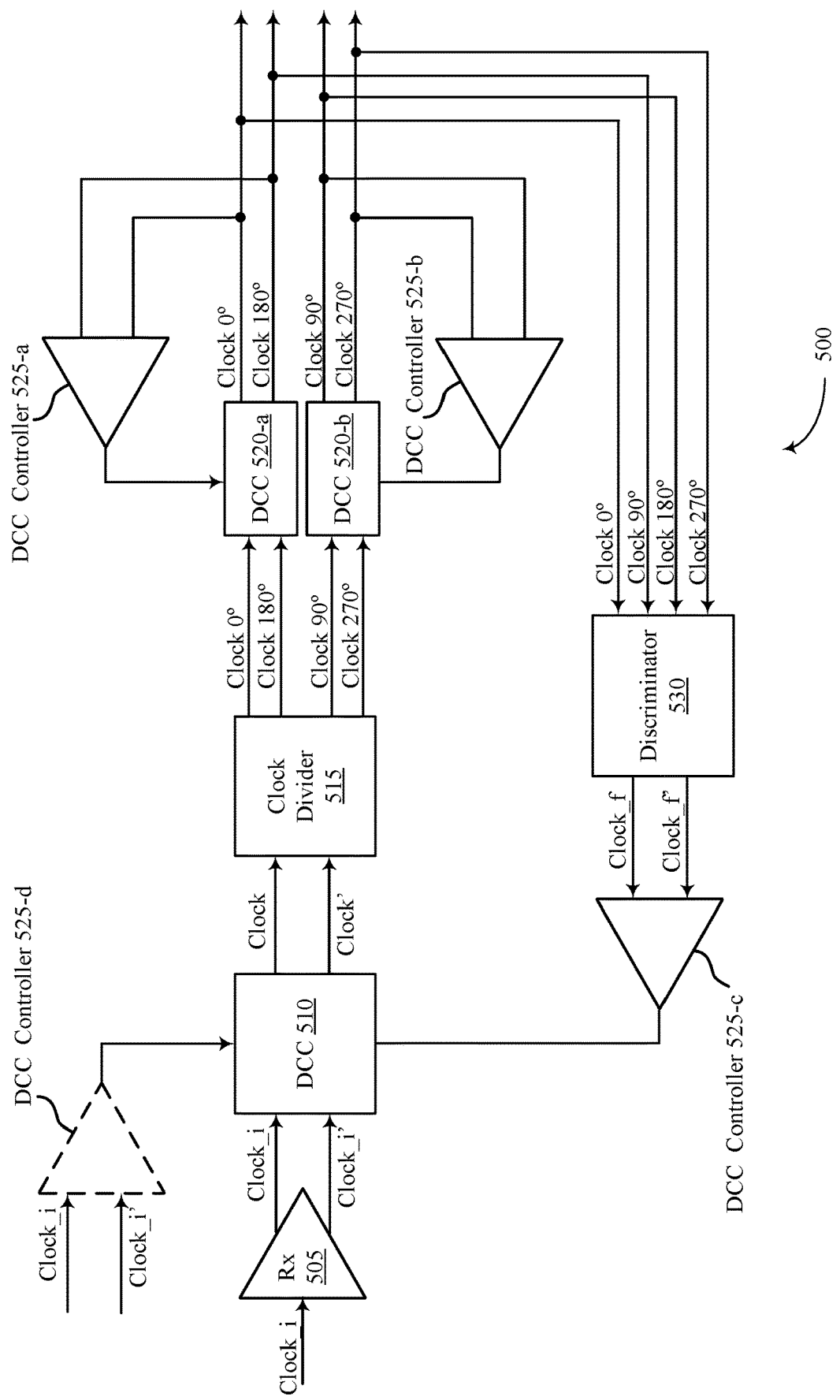
FIG. 5 illustrates an example of clock circuitry that supports phase clock correction in accordance with examples as disclosed herein.

FIG. 5 illustrates an example of clock circuitry 500 that supports phase clock correction in accordance with examples as disclosed herein. Clock circuitry 500 may be an example of clock circuitry 300 described with reference to FIG. 3. Clock circuitry 500 may include receive circuit 505, duty cycle correction (DCC) circuit 510, clock divider 515, DCC circuits 520, DCC controllers 525, and discriminator 530. The components of clock circuitry 500 may be coupled via one or more traces (also referred to herein as transmission lines). The clock circuitry 500 may correct for phase errors via one or more duty cycle adjustment stages. The first duty cycle adjustment stage may be performed by DCC circuits 520 and the second duty cycle adjustment stage may be performed by DCC circuit 510 in some examples.

The receive circuit 505 may receive a clock signal (clock_i) from another component (e.g., a component external to clock circuitry 500). The clock signal clock_i may be referred to as a high frequency clock signal because it is higher in frequency than the clock signals generated by clock divider 515. The receive circuit 505 may generate a complement signal (clock_i') for the clock signal and output both signals to DCC circuit 510. DCC circuit 510 may receive the differential pair of high frequency clock signals and generate four clock signal that are offset from one another by the same phase (e.g., 90°), plus or minus one or more phase errors (e.g., x°). Thus, DCC circuit 510 may generate and output the following clock signals: clock 0°, clock 90°, clock 180°, and clock 270°. The four clock signals may have the same frequency and may be referred to as low frequency or half frequency clock signals because they have a frequency that is lower than (e.g., half of) the frequency of the input clock. In addition to phase errors, the four clock signals may have duty cycle errors (e.g., duty cycles other than 50%).

DCC circuits 520 may each receive a differential pair (e.g., a pair of clock signals offset by approximately 180°) of the low frequency clock circuits. For instance, DCC circuit 520-a may receive clock 0° and clock 180°. And DCC circuit 520-b may receive clock 90° and clock 270°. Each DCC circuit 520 may adjust the duty cycle of one or both of its input low frequency clock signals. For instance, DCC circuit 520-a may adjust the duty cycle of clock 0° and/or clock 180°. And DCC circuit 520-b may adjust the duty cycle of clock 90° and/or clock 270°. Although shown as separate components, DCC circuit 520-a and DCC circuit 520-b may be collocated or part of the same component.

The duty cycle adjustment provided by a DCC circuit 520 may be based on a control signal (e.g., a digital control code) received from a DCC controller 525. The control signal may indicate to the DCC circuit 520 the amount by which to modify the duty cycle of a clock signal. The control signal may be based on a comparison of the duty cycles of the clock signals output by the DCC circuit 520. For example, DCC circuit 520-a may output clock 0° and clock 180°, one or both of which may have an adjusted duty cycle. DCC controller 525-a may compare the duty cycles of output clock 0° and clock 180° to determine whether there is a mismatch. If the duty cycles are different, DCC controller 525-a may control DCC circuit 520-a so that the duty cycle adjustment provided by DCC circuit 520-a results in clock signals that have the same duty cycle (e.g., 50%). A similar process may be followed by DCC circuit 520-b and DCC controller 525-b.

Adjusting the duty cycle of the low frequency clock signals may correct the duty cycles (e.g., make them all 50%). Additionally, the adjustment may move the edges of the clock signals so that edges of the differential clock pairs are aligned (e.g., the rising edges of clock 0° may coincide with the falling edges of clock 180°, and vice versa). Thus, after adjustment by DCC circuits 520, the clock 0° and clock 180° may be aligned in phase (e.g., offset by 180°), and clock 90° and clock 270° may be aligned in phase (e.g., offset by 180°). However, the differential clock pairs may still be incorrectly offset from each other.

The low frequency clock signals output by DCC circuits 520 may be transmitted to components external to clock circuitry 500 (e.g., for use in timing external operations) as well as to discriminator 530. Upon receiving the low frequency clock signals, discriminator 530 may generate a full frequency clock signal (clock_f) and its complement (clock_f) based on the low frequency clock signals. The full frequency clock and its complement may have the same frequency as the high frequency clock received by DCC circuit 510. Thus, the full frequency clock and its complement may have twice the frequency of the low frequency clock signals.

The differential clock signals generated by discriminator 530 may be transmitted to DCC controller 525-c, which may compare the duty cycles of the clock signals. Based on the comparison, the DCC controller 525-c may generate a control signal (e.g., a control code) that instructs DCC circuit 510 on how to adjust the duty cycle of incoming clock signals clock_i and clock_i'. Thus, DCC controller 525-c may control the duty cycle adjustment provided by DCC circuit 510 based on clock signals clock_f and clock_f', which in turn are based on the low frequency clock signals. After DCC circuit 510 has modified its duty cycle adjustment as instructed by DCC controller 525-c, the differential clock signals (e.g., clock and clock') output by DCC circuit 510 may be aligned in phase. Alignment of clock and clock' results in an ideal offset between the differential pairs clock 0°/180° and 90°/270°, which allows DCC circuits 520 to output ideal low frequency clock signals (e.g., low frequency clock signals with duty cycles and phases).

In some cases, clock circuitry 500 may include DCC controller 525-d. DCC controller 525-d may receive clock_i and clock_i' as inputs and output a control signal to DCC circuit 510 based on the duty cycles of clock_i and clock_i'. DCC controller 525-d may correct for initial duty cycle errors in clock_i and clock_i'. If uncorrected, these duty cycles errors may be severe enough to disrupt the operations of clock divider 515.

Figure 6:
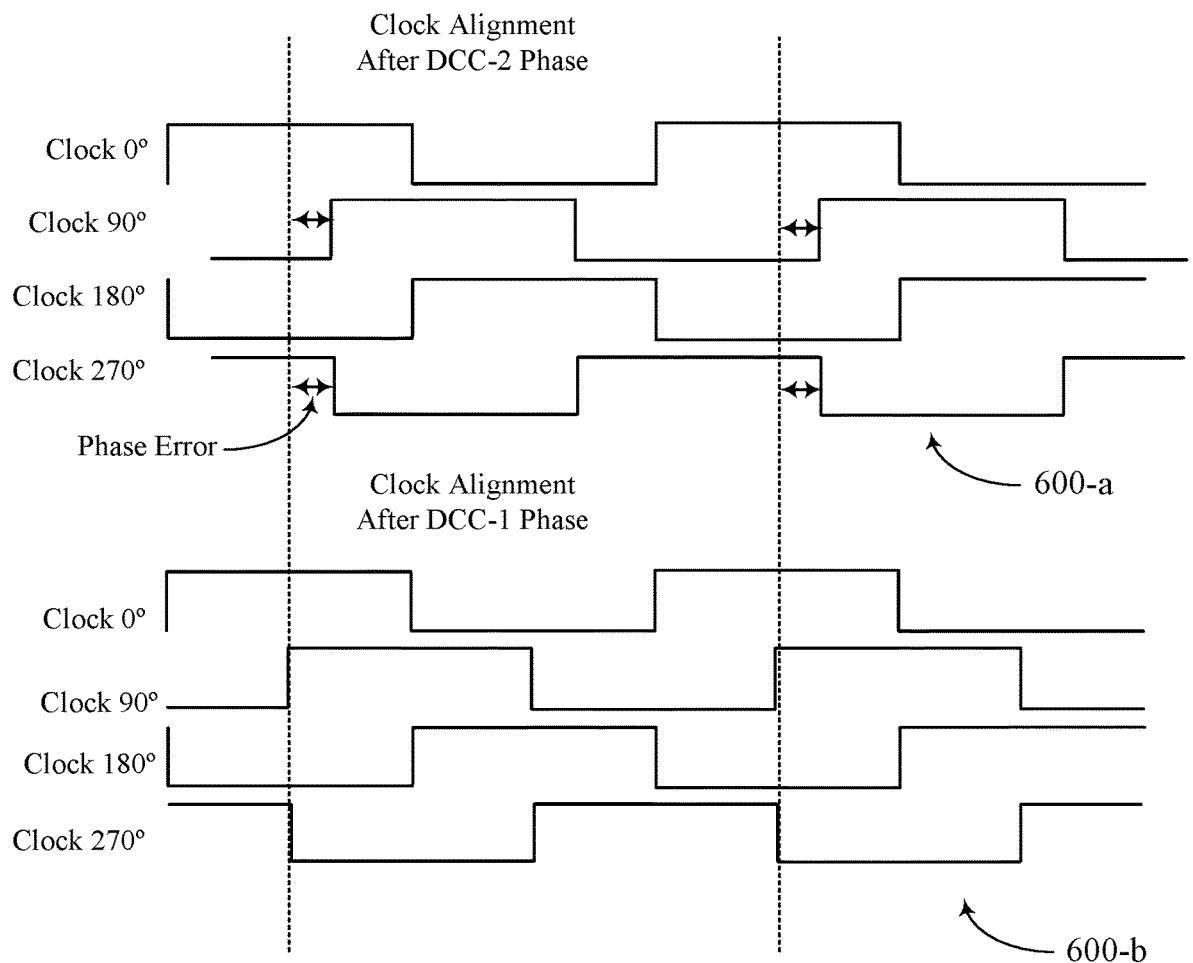
FIG. 6 illustrates an example of clock signals that support phase clock correction in accordance with examples as disclosed herein.

FIG. 6 illustrates an example of clock signals 600 that support phase clock correction in accordance with examples as disclosed herein. Clock signals 600 may include clock signals 600-a, which may represent the low frequency clock signals output by DCC circuit(s) 520 after the first stage of duty cycle adjustment has occurred (e.g., after the DCC circuits 520 have applied duty cycle adjustments, but before DCC circuit 510 has applied duty cycle adjustments). Clock signals 600 may also include clock signals 600-b, which may, in some examples, represent the low frequency clock signals output by DCC circuit(s) 520 after the second stage of duty cycle adjustment has occurred (e.g., after both DCC circuit 510 and DCC circuits 520 have applied duty cycle adjustments).

As shown by clock signals 600-a, after the first stage of duty cycle correction the duty cycles of the low frequency clocks may be equal (e.g., 50%). Also, the edges of clock 0° and clock 180° may be aligned with respect to one another and the edges of clock 90° and clock 270° may be aligned with respect to one another. However, the pairs of differential clock signals may still be incorrectly offset from each other. For example, the edges of clocks 90° and 270° may be offset from the midpoint of the high phase of clock 0° and offset from the midpoint of the low phase of clock 180°. This offset may be referred to as the phase or delay error.

The phase error may be reduced or eliminated after the second stage of duty cycle correction. As shown by clock signals 600-b, after the second stage of duty cycle correction the low frequency clock signals may be evenly dispersed in the phase domain (e.g., offset by) 90°. Thus, the timing information of the high frequency clock may be preserved.

Figure 7:
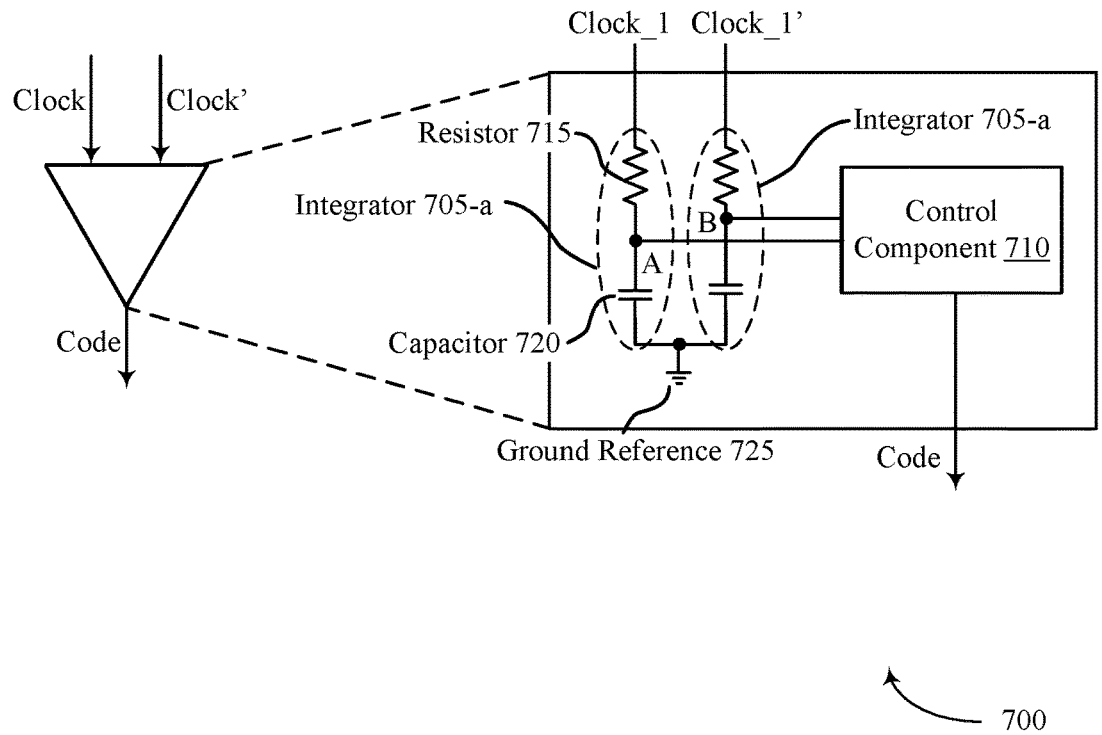
FIG. 7 illustrates an example of a duty cycle correction (DCC) controller that supports phase clock correction in accordance with examples as disclosed herein.

FIG. 7 illustrates an example of a DCC controller 700 that supports phase clock correction in accordance with examples as disclosed herein. DCC controller 700 may compare the duty cycles of two clock signals (e.g., a clock signal and its complement) and output a control code (e.g., to a DCC circuit 520) based on the difference between the duty cycles. DCC controller 700 may be an example of a DCC controller 525 as described with reference to FIG. 5. DCC controller 700 may include integrator(s) 705 and control component 710. Control component may be one or more operational amplifiers (op amps), logic circuits, digital engines, or processors.

Each integrator 705 may include a resistive component, such as a resistor 715, and a capacitive component, such as a capacitor 720. The resistor 715 and capacitor 720 may be coupled with one another (e.g., connected in series) and the capacitor may be coupled with a ground reference 725. The voltage on the node between the resistor 715 and the capacitor 720 may represent the output of an integration of the input clock signal. Thus, the voltage on node A may represent the output of the integration of clock_1 and the voltage on node B may represent the output of the integration of clock_1'. By comparing the voltage on node A and node B, the control component 710 may determine whether the duty cycles of the clock signals are equal. This is because equal duty cycles will result in equal voltages on nodes A and B, whereas a unequal duty cycles will result in a higher voltage on the node with the higher duty cycle.

To illustrate, DCC controller 700 may receive multiple clock signals as inputs. For example, DCC controller 700 may receive clock_1 and clock_1', which may be differential clock signals output by a DCC circuit 520. DCC controller 700 may integrate each signal (e.g., over multiple periods, such 100) and compare the result of each integration. For example, control component 710 may compare the voltage on node A to the voltage on node B to determine the difference between the voltages.

If one of the voltages is higher than the other, the control component 710 may output information (e.g., a code, an indication, one or more bits) indicating that the corresponding DCC circuit is to adjust its configuration to provide a different duty cycle adjustment for one or both of the clock signals. For example, if the voltage on node A is higher than the voltage on node B, the code may indicate that the DCC circuit is to decrease the duty cycle of clock_1 and/or increase the duty cycle of clock_1'. If there is no difference between the voltages, the DCC controller 700 may refrain from outputting a code. Or the DCC controller 700 may output a code that indicates that the corresponding DCC circuit is to maintain its current configuration for duty cycle adjustment.

Figure 8:
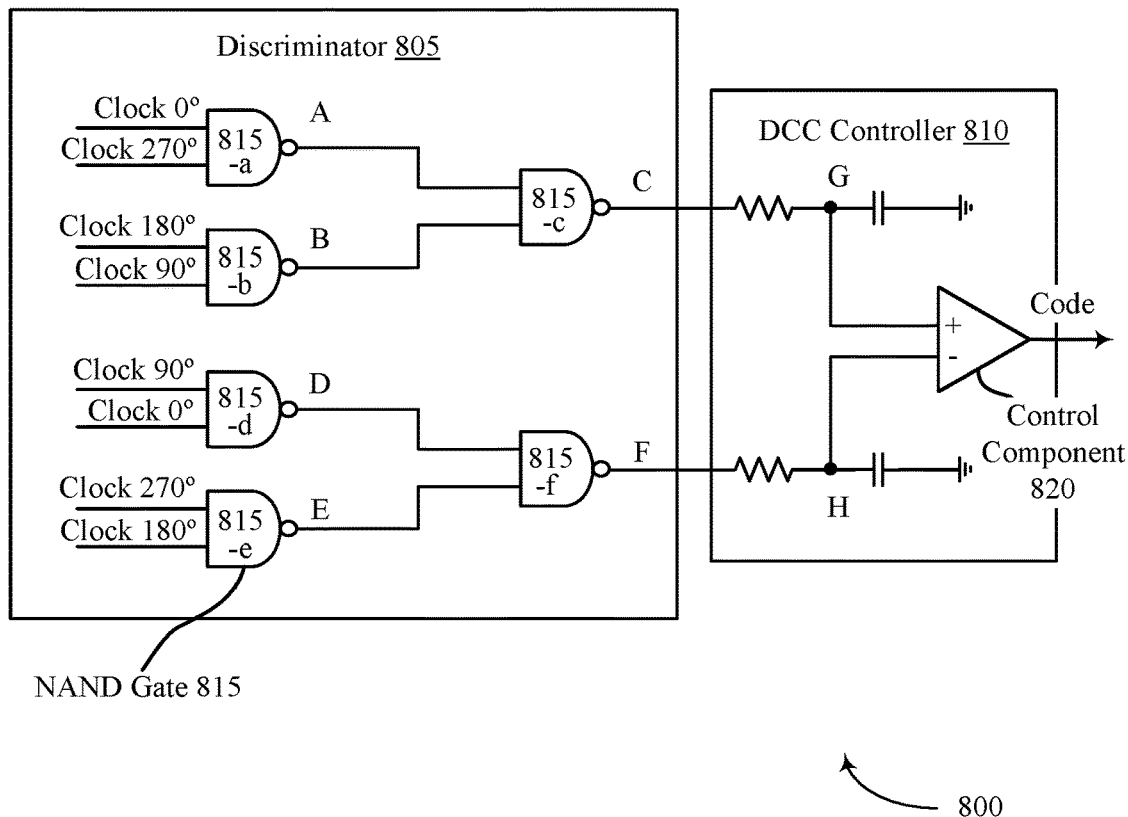
FIG. 8 illustrates an example of circuitry that supports phase clock correction in accordance with examples as disclosed herein.

FIG. 8 illustrates an example of circuitry 800 that supports phase clock correction in accordance with examples as disclosed herein. Circuitry 800 may include a quantity of nodes labeled A through F, which will be discussed with reference to FIG. 9. Circuitry 800 may also include discriminator 805 and DCC controller 810. Discriminator 805 may be an example of a discriminator 530 described with reference to FIG. 5 and DCC controller 810 may be an example of a DCC controller 525 described with reference to FIG. 5 or a DCC controller 700 described with reference to FIG. 7. Discriminator 805 may generate a pair of differential clock signals (e.g., a full frequency clock signal and its complement) based on low frequency clock signals. DCC controller 810 may output (e.g., to a DCC circuit 520) a control code based on the duty cycles of the differential clock signals output by the discriminator 805.

Discriminator 805 may include multiple logic gates, such as NAND gates 815. A set of the NAND gates 815 (e.g., NAND gates 815-a, 815-b, 815-d, and 815-e) may receive a pair of low frequency clock signals as inputs. For example, NAND gate 815-a may receive clock 0° and clock 270°, NAND gate 815-b may receive clock 180° and clock 90°, NAND gate 815-d may receive clock 0° and clock 90°, and NAND gate 815-e may receive clock 270° and clock 180°. Thus, the NAND gates 815-a, 815-b, 815-d, and 815-e may each receive a unique combination of the low frequency inputs.

The outputs of NAND gates 815-a, 815-b, 815-d, and 815-e may be coupled with the inputs of other NAND gates 815. For example, NAND gate 815-a and NAND gate 815-b may be coupled with NAND gate 815-c, and NAND gate 815-d and NAND gate 815-e may be coupled with NAND gate 815-f. Thus, NAND gate 815-c may receive the results of two NAND operations from NAND gates 815-*a* and 815-*b*. Similarly, NAND gate 815-*f* may receive the results of two NAND operations from NAND gates 815-*a* and 815-*b*. 815-*c* may perform a NAND operation on its inputs and output the result (e.g., a full frequency clock signal) to a first input of DCC controller 810. Similarly, 815-*f* may perform a NAND operation on its inputs and output the result (e.g., the complement of the full frequency clock signal) to a second input of DCC controller 810.

DCC controller 810 may integrate the clock signal received from NAND gate 815-*c* and the clock signal received from NAND gate 815-*f* as discussed with reference to FIG. 7. The voltage levels arising from the integration may be input into a control component 820, which may be an example of control component 710 described with reference to FIG. 7. Control component 820 may compare the voltage levels to determine the duty cycles of the full frequency clock signals. Based on the comparison, DCC controller 810 may output a control code (e.g., to a DCC circuit).

Although described with reference to NAND gates, the discriminator 805 may be implemented using any type of logic gates, including AND gates, OR gates, NOR gates, XOR gates, etc.

Figure 9:
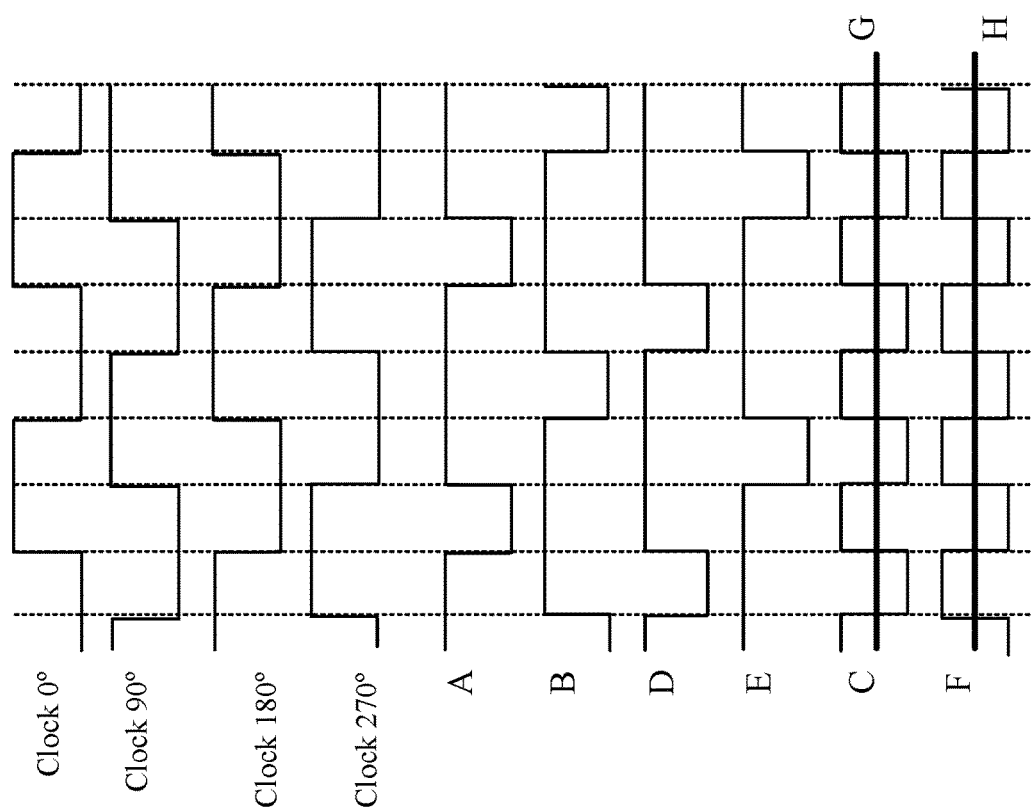
FIG. 9 illustrates an example of waveforms that support phase clock correction in accordance with examples as disclosed herein.
Figure 9:
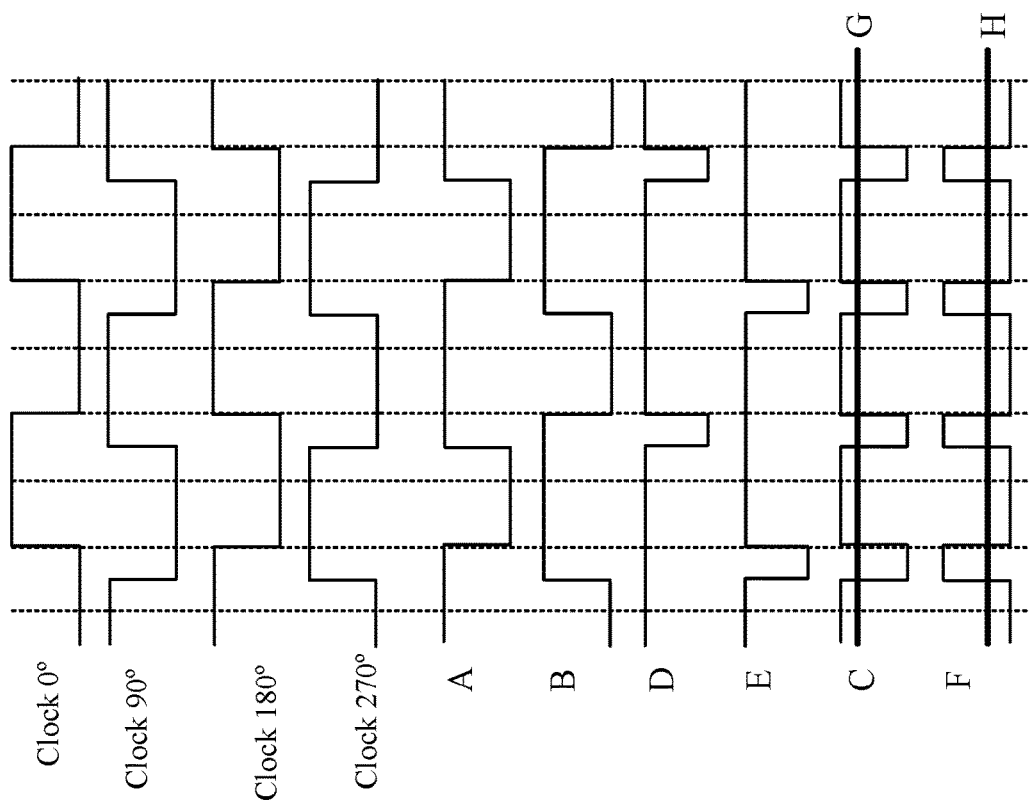

FIG. 9 illustrates an example of waveforms 900 that support phase clock correction in accordance with examples as disclosed herein. Waveforms 900 may represent the input and output signals of various components of circuitry 800. For example, clock 0°, clock 90°, clock 180°, and clock 270° may represent the low frequency clock signals input into NAND gates 815-*a*, 815-*b*, 815-*d*, and 815-*f*. And waveforms A through G may represent the signals present on nodes A through G, respectively. The waveforms 900-*a* are examples of waveforms that arise when clock signal 90 and clock 270 are delayed (e.g., late or offset in the phase domain). The waveforms 900-*b* are examples of waveforms that arise when the low frequency clocks signals have ideal phase offsets (e.g., are spaced by 90° in the phase domain).

As shown in FIG. 8, the voltage on node A at any given time may be the result of a NAND operation on clock 0° and clock 270° and the voltage on node B at any given time may be the result of a NAND operation on clock 90° and 180°. The voltage on node D at any given time may be the result of a NAND operation on clock 0° and clock 90° and the voltage on node E at any given time may be the result of a NAND operation on clock 180° and 270°. Further, the voltage on node C at any given time may be the result of a NAND operation on the waveforms A and B. And the voltage on node F at any given time may be the result of a NAND operation on the waveforms D and E. When considered over time, the voltage on node C may represent a full frequency clock signal and the voltage on node F may represent the complement of the full frequency clock signal.

As illustrated by waveforms 900-*a*, an incorrect offset between low frequency clock signals (e.g., a delay in clock 90° and clock 270°) results in full frequency clock signals with non-ideal duty cycles (e.g., duty cycles other than 50%). For instance, the waveform produced on node C may be a clock signal with duty cycle greater than 50%, and its complement, the waveform produced on node F, may be a clock signal with duty cycle less than 50%.

Because the duty cycles of the full frequency clock signals are not 50%, integrating the waveforms on nodes C and F may result in voltages that are at different levels. For example, the voltage on node G may be greater than the voltage on node H. If these two voltages are unequal, the control component 820 may instruct (e.g., via a control code) its associated DCC circuit (e.g., DCC circuit 510) to modify the duty cycle adjustment it provides. The new duty cycle adjustment may be based on the difference between the voltages on G and H (and thus may be based on the difference in duty cycles between the waveforms on C and F).

As illustrate by waveforms 900-*b*, a low frequency clock signals with ideal phases result in clock signals with duty cycles of 50%. For example, the waveform produced on node C is a clock signal with 50% duty cycle. And the waveform produced on node F is the complement of the waveform produced on C. The clock signal is a full frequency clock signal in that its frequency is twice as fast as the low frequency clock signals. Thus, when the low frequency clock signals are evenly spaced in the phase domain, the circuitry 800 may output a full frequency clock signal and its complement with 50% duty cycle.

Because the duty cycles of the full frequency clock signals are 50%, integrating the waveforms on nodes C and F may result in voltages that are the same level. For example, the voltage on node G may be equal to the voltage on node H. If these two voltages are equal, the control component 820 refrain from sending a control code to its associated DCC circuit (e.g., DCC circuit 510). Or the control component 820 may transmit a control code that instructs the DCC circuit to maintain its current level of duty cycle adjustment.

Figure 10:
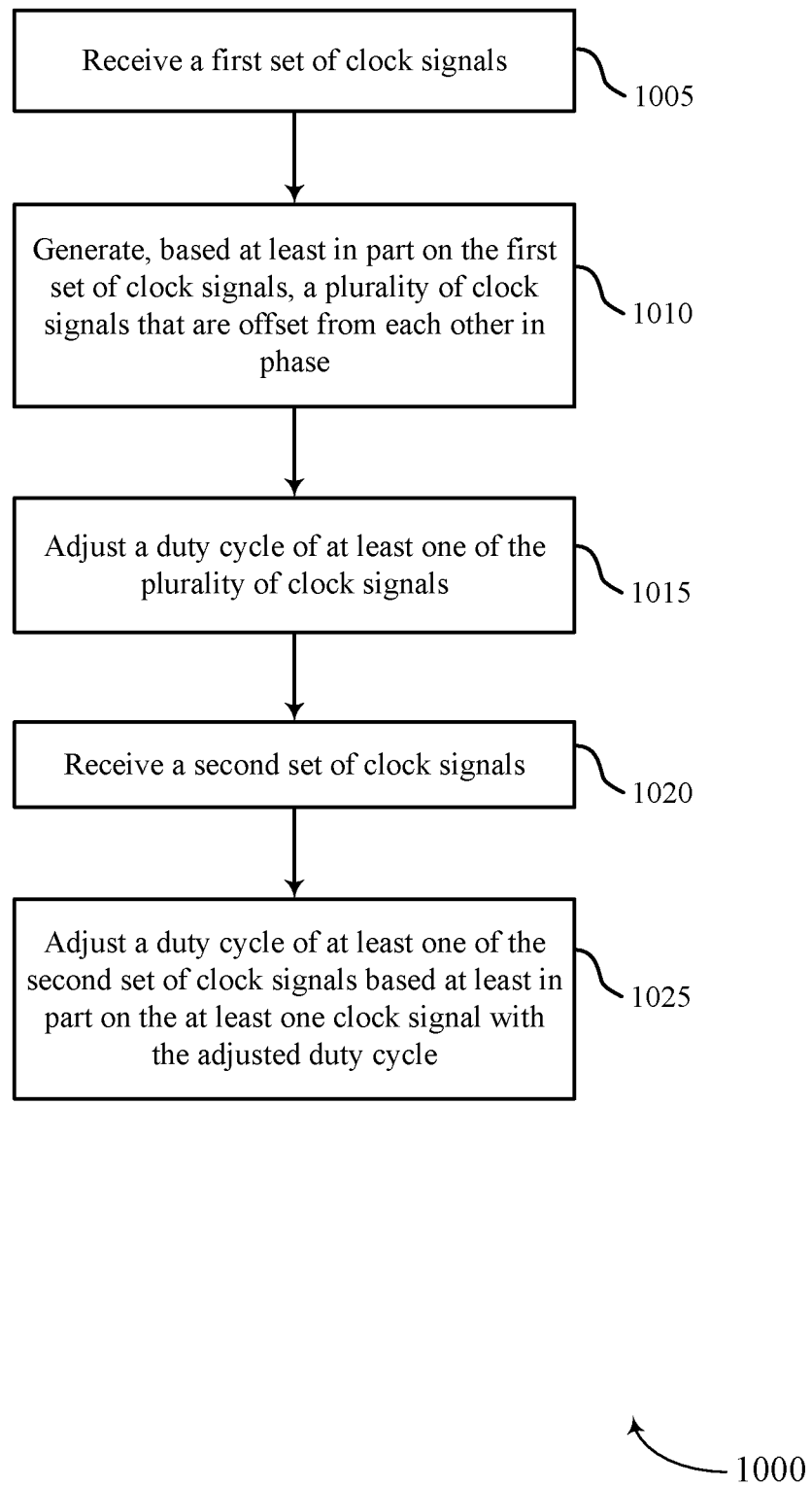
FIG. 10 shows a flowchart illustrating a method or methods that support phase clock correction in accordance with various examples as disclosed herein.

FIG. 10 shows a flowchart illustrating a method 1000 that supports phase clock correction in accordance with various examples as disclosed herein. The operations of method 1000 may be implemented by an apparatus or its components as described herein. In some examples, a memory controller may execute a set of instructions to control the functional elements of the apparatus to perform the functions described below. Additionally or alternatively, an apparatus may perform the functions described below using special-purpose hardware.

At 1005, the method may include receiving a first set of clock signals. The first set of clock signals may include two clock signals (e.g., clock and clock' as described with reference to FIG. 5). The operations of 1005 may be performed according to the methods described with reference to FIGS. 3 through 9. In some examples, the operations of 1005 may be performed by a DCC circuit 510 as described with reference to FIG. 5.

At 1010, the method may include generating, based at least in part on the first set of clock signals, a plurality of clock signals that are offset from each other in phase. The plurality of clock signals may include four clock signals (e.g., clock 0°, 90°, 180°, and 270° as described with reference to FIGS. 3 through 9). The operations of 1010 may be performed according to the methods described with reference to FIGS. 3 through 9. In some examples, the operations of 1010 may be performed by a clock divider as described with reference to FIGS. 3 and 5.

At 1015, the method may include adjusting a duty cycle of at least one of the plurality of clock signals. The operations of 1015 may be performed according to the methods described with reference to FIGS. 3 through 9. In some examples, the operations of 1015 may be performed by a DCC circuit 520 as described with reference to FIG. 5.

At 1020, the method may include receiving a second set of clock signals. The first set of clock signals and the second set of clock signals may be received from the same source (e.g., a clock) over the same set of transmission lines. Thus, the first set of clock signals may be those received during a first period of time and the second set of clock signals may be those received during a second, later period of time. In some examples, the first set of clock signals and the second set of clock signals have a first frequency (e.g., $f_1$) and the plurality of clock signals have a second frequency (e.g., $f_1/2$) that is different than the first frequency. The operations of 1020 may be performed according to the methods described with reference to FIGS. 3 through 9. In some examples, the operations of 1020 may be performed by a DCC circuit 510 as described with reference to FIG. 5.

At 1025, the method may include adjusting a duty cycle of at least one of the second set of clock signals based at least in part on the at least one clock signal with the adjusted duty cycle. The operations of 1025 may be performed according to the methods described with reference to FIGS. 3 through 9. In some examples, the operations of 1025 may be performed by a DCC circuit 510 as described with reference to FIG. 5.

In some examples, an apparatus as described herein may perform a method or methods, such as the method 1000. The apparatus may include features, means, or instructions (e.g., a non-transitory computer-readable medium storing instructions executable by a processor) for: determining, after adjusting the duty cycle of the at least one clock signal, a difference in duty cycle between two of the plurality of clock signals; generating a new plurality of clock signals; and adjusting a duty cycle of at least one of the new plurality of clock signals based at least in part on the difference. In such cases, the apparatus may also include features, means, or instructions (e.g., a non-transitory computer-readable medium storing instructions executable by a processor) for receiving a third set of clock signals and adjusting a duty cycle of the third set of clock signals based at least in part on the new plurality of clock signals with the at least one adjusted duty cycle. The third set of clock signals may be received from the same source as the first and second set of clock signals. Additionally or alternatively, the apparatus may include features, means, or instructions (e.g., a non-transitory computer-readable medium storing instructions executable by a processor) for integrating each of the two clock signals, wherein the difference between duty cycles is determined based at least in part on the integration.

Some examples of the method, apparatuses, and non-transitory computer-readable medium described herein may further include operations, features, means, or instructions for 1) generating a first clock signal (e.g., clock_f) and a second clock signal (e.g., clock_f') based at least in part on the plurality of clock signals and 2) comparing a duty cycle of the first clock signal with a duty cycle of the second clock signal, wherein adjusting the duty cycle of the second set of clock signals is based at least in part on the comparison. In some cases, the first clock signal, the second clock signal, and the second set of clock signals have a same frequency.

Some examples of the method, apparatuses, and non-transitory computer-readable medium described herein may further include operations, features, means, or instructions for adjusting the duty cycle of the at least one clock signal by 1) adjusting a duty cycle of a first clock signal that is offset in phase from a second clock signal by 180 degrees plus or minus a first phase error and 2) adjusting a duty cycle of a third clock signal that is offset in phase from a fourth clock signal by 180 degrees plus or minus a second phase error.

It should be noted that the methods described above describe possible implementations, and that the operations and the steps may be rearranged or otherwise modified and that other implementations are possible. Furthermore, steps of two or more of the methods may be combined.

In some examples, an apparatus or device may perform the functions described herein using general- or special-purpose hardware. The apparatus or device may include: a first circuit (e.g., DCC circuit 510) coupled with an input of a clock dividing circuit (e.g., clock divider 515) and operable to adjust a duty cycle of a set of clock signals (e.g., clock_i and clock_i'); a second circuit (e.g., DCC circuit 520-a, DCC circuit 520-b, or a circuit that includes both) coupled with an output of the clock dividing circuit and operable to adjust a duty cycle of at least one of a plurality of clock signals (e.g., clock 0°, 90°, 180°, and/or 270°) output by the clock dividing circuit; a third circuit (e.g., discriminator 530) coupled with the second circuit and operable to output two clock signals based at least in part on the plurality of clock signals with at least one of the plurality of clock signals having a duty cycle adjusted by the second circuit; and a control component (e.g., DCC controller 525-c or a control component within DCC controller 525-c, such as a control component 710) coupled with the third circuit and operable to modify, based at least in part on the two clock signals, the duty cycle adjustment provided by the first circuit.

In some cases, the clock dividing circuit is operable or configured to generate the plurality of clock signals based at least in part on the set of clock signals.

In some examples, the apparatus or device may include an integrator (e.g., an integrator within DCC controller 525-a) coupled with an output of the second circuit and operable or configured to integrate a first clock signal (e.g., clock 0°) output by the second circuit. In such cases, the apparatus or device may include a second control component (e.g., a control component within DCC controller 525-a) coupled with the integrator and an input of the second circuit. In some examples, the apparatus or device may include a second integrator (e.g., a second integrator within DCC controller 525-b) coupled with a second output of the second circuit and an input of the second control component (e.g., the control component within DCC controller 525-a). The second integrator may be operable or configured to integrate a second clock signal output (e.g., clock 180°) by the second circuit.

In some cases, the apparatus or device includes an integrator (e.g., an integrator within DCC controller 525-c) coupled with an output of the third circuit and the input of the control component (e.g., the control component within DCC controller 525-c). The integrator may be operable or configured to integrate at least one of the two clock signals (e.g., clock_f and/or clock_f') output by the third circuit.

In some examples, the apparatus or device includes a circuit (e.g., receive circuit 505) coupled with an input of the first circuit. The circuit may be operable or configured to receive a first clock signal (e.g., clock_i) and provide the first clock signal and a second clock signal (e.g., clock_i') that is a complement of the first clock signal to the first circuit. The set of clock signals may include the first clock signal and the second clock signal.

In some examples, the third circuit includes 1) a first set of NAND gates (e.g., NAND gates 815-a, 815-b, and 815-c) operable or configured to output to the control component a first clock signal (e.g., clock_f) of the two clock signals and 2) a second set of NAND gates (e.g., NAND gates 815-d, 815-e, and 815-f) operable to output to the control component a second clock signal (e.g., clock_f') of the two clock signals.

In some cases, the apparatus or device may include: a first circuit (e.g., DCC circuit 510) operable or configured to adjust a duty cycle of a first clock signal of two clock signals; a clock dividing circuit (e.g., clock divider 515) operable or configured to receive the two clock signals, after adjustment of the duty cycle of the first clock signal, and generate four clock signals that are each offset in phase; a second circuit (e.g., DCC circuit 520-*a*) operable or configured to receive a first pair of the four clock signals and adjust a duty cycle of at least one of the clock signals of the first pair; and a third circuit (e.g., DCC circuit 520-*b*) operable or configured to receive a second pair of the four clock signals and adjust a duty cycle of at least one of the clock signals of the second pair.

In some cases, the apparatus or device may include a fourth circuit (e.g., discriminator 530) coupled with the second and third circuits. The fourth circuit may be operable or configured to generate a third pair of clock signals based at least in part on the first and second pairs of clock signals. In these or other cases, the apparatus or device may include: a fifth circuit (e.g., DCC controller 525-*c* or a combination of integrators 705-*a* and 705-*b*) operable or configured to integrate the third pair of clock signals; and a control component (e.g., a control component within DCC controller 525-*c*) operable or configured to control the duty cycle adjustment provided by the first circuit based at least in part on the integration of the third pair of clock signals.

In some cases, the first pair of clock signals includes a first clock signal (e.g., clock 0°) with a first duty cycle adjusted by the second circuit (e.g., DCC circuit 520-*a*) and a second clock signal (e.g., clock 180°) with a second duty cycle. In these or other cases, the apparatus or device may include: a fourth circuit (e.g., DCC controller 525-*a*) operable or configured to compare the first duty cycle of the first clock signal to the second duty cycle of the second clock signal; and a control component (e.g., a control component within DCC controller 525-*a*) operable or configured to control the duty cycle adjustment provided by the second circuit based at least in part on the comparison. In some examples, the fourth circuit includes an integrator operable to integrate a clock signal of the first pair of clock signals.

In some cases, the second pair of clock signals comprises a third clock signal (e.g., clock 90°) with a third duty cycle adjusted by the third circuit and a fourth clock signal (e.g., clock 270°) with a fourth duty cycle. In these or other cases, the apparatus or device may include: a fifth circuit (e.g., DCC controller 525-*b*) operable or configured to compare the third duty cycle of the third clock signal to the fourth duty cycle of the fourth clock signal; and a second control component (e.g., a control component within DCC controller 525-*b*) operable or configured to control the duty cycle adjustment provided by the third circuit based at least in part on comparing the third duty cycle to the fourth duty cycle. In some examples, the clock signals of the first pair of clock signals and the second pair of clock signals are offset in phase by 90 degrees plus or minus one or more phase errors.

It should be noted that the methods described above describe possible implementations, and that the operations and the steps may be rearranged or otherwise modified and that other implementations are possible. Furthermore, steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving a first set of clock signals;
   generating, based at least in part on the first set of clock signals, a plurality of clock signals that are offset from each other in phase;
   adjusting a duty cycle of at least one clock signal of the plurality of clock signals;
   receiving a second set of clock signals; and
   adjusting a duty cycle of at least one clock signal of the second set of clock signals based at least in part on the at least one clock signal of the plurality of clock signals with the adjusted duty cycle.

2. The method of claim 1, further comprising:
   determining, after adjusting the duty cycle of the at least one clock signal of the plurality of clock signals, a difference in duty cycle between two of the plurality of clock signals;
   generating a new plurality of clock signals; and
   adjusting a duty cycle of at least one of the new plurality of clock signals based at least in part on the difference.

3. The method of claim 2, further comprising:
   receiving a third set of clock signals; and
   adjusting a duty cycle of the third set of clock signals based at least in part on the new plurality of clock signals with the at least one adjusted duty cycle.

4. The method of claim 2, further comprising:
   integrating each of the two clock signals of the plurality of clock signals, wherein the difference is determined based at least in part on the integration.

5. The method of claim 1, further comprising:
   generating a first clock signal and a second clock signal based at least in part on the plurality of clock signals; and
   comparing a duty cycle of the first clock signal with a duty cycle of the second clock signal, wherein adjusting the duty cycle of the at least one clock signal of the second set of clock signals is based at least in part on the comparison.

6. The method of claim 5, wherein the first clock signal, the second clock signal, and the second set of clock signals have a same frequency.

7. The method of claim 1, wherein adjusting the duty cycle of the at least one clock signal of the plurality of clock signals comprises:
   adjusting a duty cycle of a first clock signal that is offset in phase from a second clock signal by 180 degrees plus or minus a first phase error; and
   adjusting a duty cycle of a third clock signal that is offset in phase from a fourth clock signal by 180 degrees plus or minus a second phase error.

8. The method of claim 1, wherein the first set of clock signals and the second set of clock signals are received over a same set of transmission lines.

9. The method of claim 1, wherein the first set of clock signals and the second set of clock signals have a first frequency and the plurality of clock signals have a second frequency that is different than the first frequency.

10. An apparatus, comprising:
    a first circuit operable to adjust a duty cycle of a first clock signal of two clock signals;
    a clock dividing circuit operable to receive the two clock signals, after adjustment of the duty cycle of the first clock signal, and generate four clock signals that are each offset in phase;
    a second circuit operable to receive a first pair of the four clock signals and adjust a duty cycle of at least one of the clock signals of the first pair of the four clock signals; and
    a third circuit operable to receive a second pair of the four clock signals and adjust a duty cycle of at least one of the clock signals of the second pair of the four clock signals.

11. The apparatus of claim 10, further comprising:
    a fourth circuit coupled with the second and third circuits, the fourth circuit operable to generate a third pair of clock signals based at least in part on the first pair of the four clock signals and the second pair of the four clock signals.

12. The apparatus of claim 11, further comprising:
    a fifth circuit operable to integrate the third pair of clock signals; and
    a control component operable to control a duty cycle adjustment provided by the first circuit based at least in part on the integration of the third pair of clock signals.

13. The apparatus of claim 10, wherein the first pair of the four clock signals comprises a first clock signal with a first duty cycle adjusted by the second circuit and a second clock signal with a second duty cycle, the apparatus further comprising:
    a fourth circuit operable to compare the first duty cycle of the first clock signal to the second duty cycle of the second clock signal; and
    a control component operable to control a duty cycle adjustment provided by the second circuit based at least in part on the comparison.

14. The apparatus of claim 13, wherein the second pair of the four clock signals comprises a third clock signal with a third duty cycle adjusted by the third circuit and a fourth clock signal with a fourth duty cycle, the apparatus further comprising:
    a fifth circuit operable to compare the third duty cycle of the third clock signal to the fourth duty cycle of the fourth clock signal; and a second control component operable to control a duty cycle adjustment provided by the third circuit based at least in part on comparing the third duty cycle to the fourth duty cycle.

15. The apparatus of claim 13, wherein the fourth circuit comprises an integrator operable to integrate a clock signal of the first pair of the four clock signals.

16. The apparatus of claim 10, wherein the clock signals of the first pair of the four clock signals and the second pair of the four clock signals are offset in phase by 90 degrees plus or minus one or more phase errors.

* * * * *